(12) United States Patent
Po-Kai et al.

(10) Patent No.: US 12,720,794 B2
(45) Date of Patent: Aug. 25, 2026

(54) SEMICONDUCTOR DEVICES AND METHODS OF FABRICATING THE SAME

(71) Applicant: Taiwan Semiconductor Manufacturing Company, Ltd., Hsinchu (TW)

(72) Inventors: Hsiao Po-Kai, Hsinchu (TW); Cheng-Wei Chen, Hsinchu (TW); Yi-Ting Chen, Hsinchu (TW); Pei Tsang Ho, Hsinchu (TW); Wei-Yang Tseng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 438 days.

(21) Appl. No.: 18/341,549

(22) Filed: Jun. 26, 2023

(65) Prior Publication Data

US 2024/0429317 A1 Dec. 26, 2024

(51) Int. Cl.

| | |
|---|---|
| ***H10D 30/62*** | (2025.01) |
| ***H10D 30/01*** | (2025.01) |
| ***H10P 14/60*** | (2026.01) |
| ***H10P 14/692*** | (2026.01) |

(52) U.S. Cl.

CPC ....... *H10D 30/6211* (2025.01); *H10D 30/024* (2025.01); *H10P 14/6308* (2026.01); *H10P 14/6336* (2026.01); *H10P 14/6339* (2026.01); *H10P 14/69215* (2026.01)

(58) Field of Classification Search

CPC .. H10D 30/6211; H10D 30/024; H10D 30/62; H01L 21/02164; H01L 21/02236; H10P 14/6308; H10P 14/6336; H10P 14/6339; H10P 14/69215

See application file for complete search history.

(56) References Cited

U.S. PATENT DOCUMENTS

| | | | | |
|---|---|---|---|---|
| 2019/0385898 | A1* | 12/2019 | Peng | H10D 84/0158 |
| 2020/0075342 | A1* | 3/2020 | Chen | H10D 84/0158 |

FOREIGN PATENT DOCUMENTS

| | | |
|---|---|---|
| TW | 202320224 A | 5/2023 |

OTHER PUBLICATIONS

Office Action issued in connection with Taiwan Appl. No. 112147764 dated Aug. 2, 2024.

* cited by examiner

*Primary Examiner* — Julia Slutsker
(74) *Attorney, Agent, or Firm* — Foley & Lardner LLP

(57) ABSTRACT

A semiconductor device includes a semiconductor fin. The semiconductor device includes a first silicon oxide layer contacting the semiconductor fin at a first interface and including nitrogen at a first concentration. The semiconductor device includes a second silicon oxide layer contacting the first silicon oxide layer at a second interface and including nitrogen at a second concentration that is greater than the first concentration. And the semiconductor device further includes a gate electrode over the second silicon oxide layer.

20 Claims, 17 Drawing Sheets

T1
351
T2
352
304
T1
348
306
302
W1
352
304
W2
404
351
354
300
350

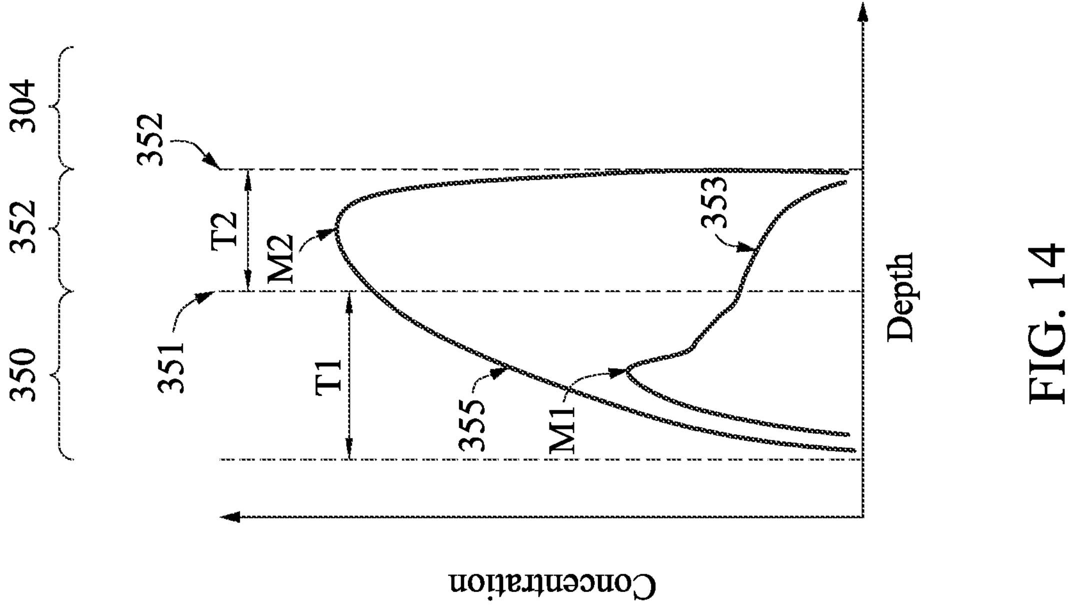
FIG. 14
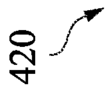

SEMICONDUCTOR DEVICES AND METHODS OF FABRICATING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin field-effect transistor (FinFET) devices are becoming more commonly used in integrated circuits. FinFET devices have a three-dimensional structure that comprises a fin (or fin-like active region) protruding from a substrate. A gate structure, configured to control the flow of charge carriers within a conductive channel of the FinFET device, wraps around a channel region the fin. For example, in a tri-gate FinFET device, the gate structure wraps around three sides of the fin, thereby forming conductive channels on three sides of the fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 14 illustrates a schematic distribution of various elements present in portions of the example FinFET of one or more of FIGS. 3-12 and 15-17, in accordance with some embodiments of the present disclosure.

DETAILED DESCRIPTION

Figure 1:
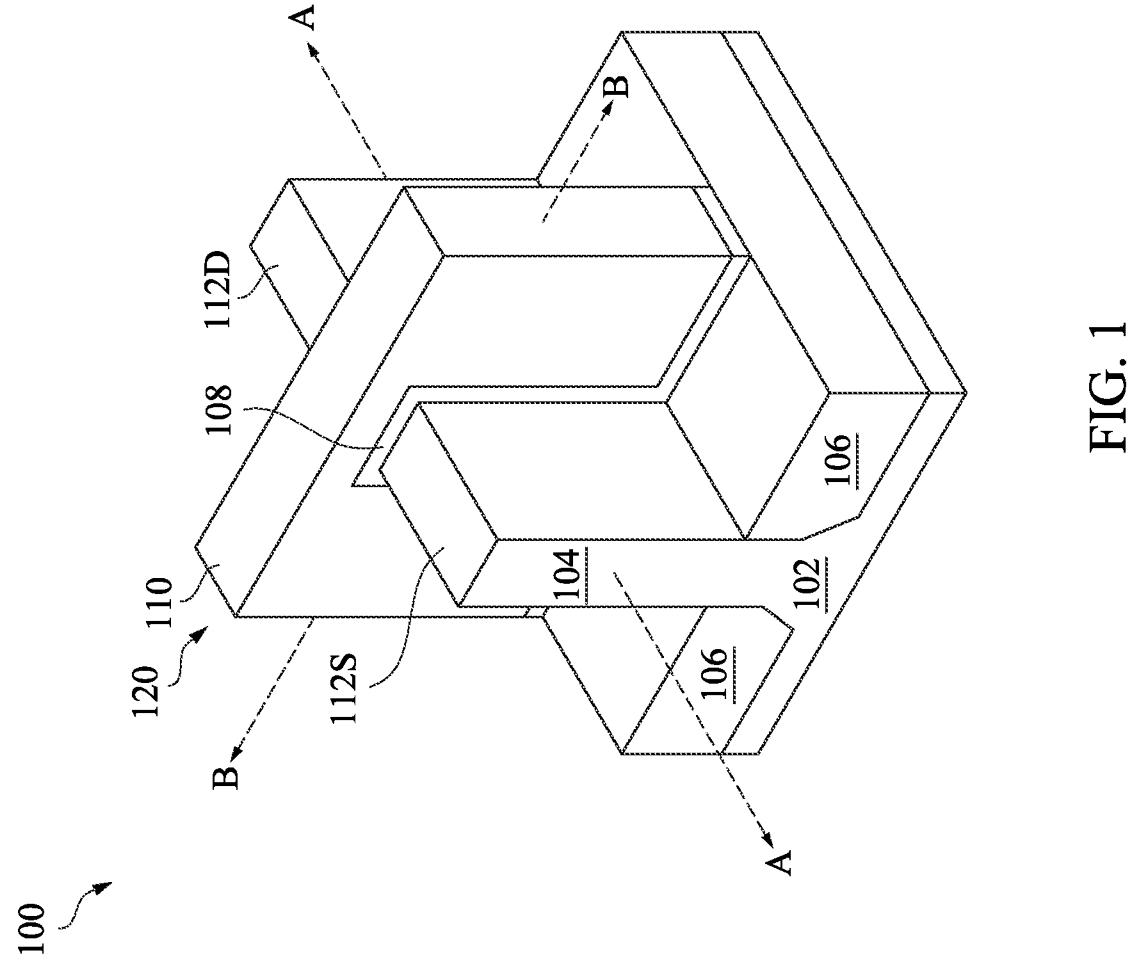
FIG. 1 illustrates a three-dimensional perspective view of an example non-planar semiconductor device, such as a fin field-effect transistor (FinFET) device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the terms "about" and "approximately" generally mean plus or minus 10% of the stated value. For example, about 0.5 would include 0.45 and 0.55, about 10 would include 9 to 11, about 1000 would include 900 to 1100.

FIG. 1 illustrates a perspective view of an example non-planar semiconductor device (hereafter referred to as device) 100, such as a FinFET or a multi-gate transistor (e.g., a gate-all-around, or GAA, transistor), in accordance with various embodiments. The device 100 includes a substrate 102 and a fin 104 protruding above the substrate 102. Isolation regions 106 are formed on opposing sides of the fin 104, with the fin 104 protruding above the isolation regions 106. A gate dielectric layer 108 traverses a channel region of the fin 104, such that it is formed along sidewalls and over a top surface of the fin 104, and a gate electrode 110 is over the gate dielectric layer 108, which together form a gate structure 120. Source/drain regions 112D and 112S are disposed in and over the fin 104 and on opposing sides of the gate dielectric layer 108 and the gate electrode 110. The source/drain regions 112D and 112S extend outward from the gate electrode 110. FIG. 1 is provided as a reference to illustrate a number of cross-sections in subsequent figures. For example, cross-sections illustrated in FIGS. 3, 4, 7, 9, 12, and 15 are taken along line B-B, which extends along a longitudinal axis of the gate structure 120 of the device 100. Cross-sections illustrated in FIGS. 5, 6, 8, 10, 13, 16, and 17 are taken along line A-A, which extends along a longitudinal axis of the fin 104 and in a direction of, for example, a current flow across the channel region of the fin 104 between the source/drain regions 112S/112D. Subsequent figures refer to these reference cross-sections for clarity.

Figure 2:
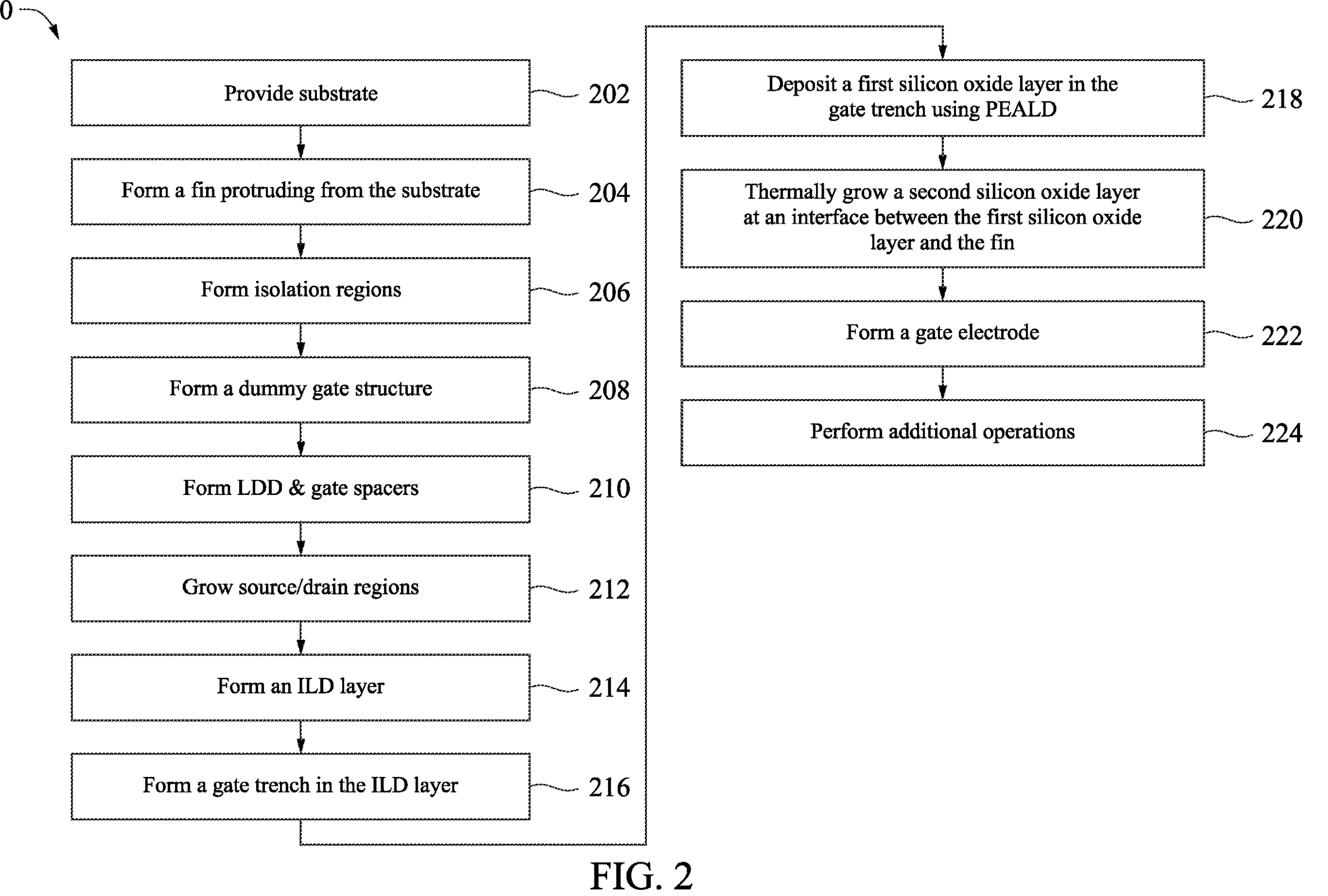
FIG. 2 illustrates a flow chart of an example method for making an example non-planar transistor, in accordance with some embodiments of the present disclosure.

FIG. 2 illustrates a flowchart of a method 200 to form a non-planar semiconductor device, according to one or more embodiments of the present disclosure. For example, at least some of the operations of the method 200 can be used to form a FinFET (e.g., device 100), a multi-gate transistor (e.g., a GAA transistor), including a nanosheet transistor or a nanowire transistor device, a vertical transistor, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET 300 (hereafter referred to as device 300) at various fabrication stages as shown in FIGS. 3-12 and 15-17, which will be discussed in further detail below. It is noted that the method 200 may be implemented to fabricate non-planar devices of different configurations, such as a GAA transistor. Furthermore, embodiments of the device 300 are not limited to those depicted herein. For example, the device 300 may include a number of other devices such as inductors, fuses, capacitors, coils, etc., which are not shown herein for purposes of clarity.

In brief overview, the method 200 starts with operation 202 of providing a substrate. The method 200 continues to operation 204 of forming a fin protruding from the substrate. The method 200 continues to operation 206 of forming isolation regions. The method 200 continues to operation 208 of forming a dummy gate structure to engage with or straddle a channel region of the fin. The method 200 continues to operation 210 of forming lightly doped drain (LDD) regions and gate spacers. The gate spacers are extended along sidewalls of the dummy gate structure. The method 200 continues to operation 212 of growing source/drain regions adjacent to each dummy gate structure. The method 200 continues to operation 214 of forming an interlayer dielectric (ILD). The method 200 continues to operation 216 of removing the dummy gate structure to form a gate trench, thereby re-exposing the channel region of the fin. The method 200 continues to operation 218 of depositing a first silicon oxide layer in the gate trench using a plasma-enhanced atomic layer deposition (PEALD) process. The method 200 continues to operation 220 of thermally growing a second silicon oxide layer at an interface between the first silicon oxide layer and the fin, where the first silicon oxide layer and the second silicon oxide layer together form a gate dielectric layer. The method 200 continues to operation 222 of forming a gate electrode over the gate dielectric layer to complete formation of a metal gate structure. The method 200 continues to operation 224 of performing additional operations, such as forming a gate contact to electrically couple to the metal gate structure.

Figure 3:
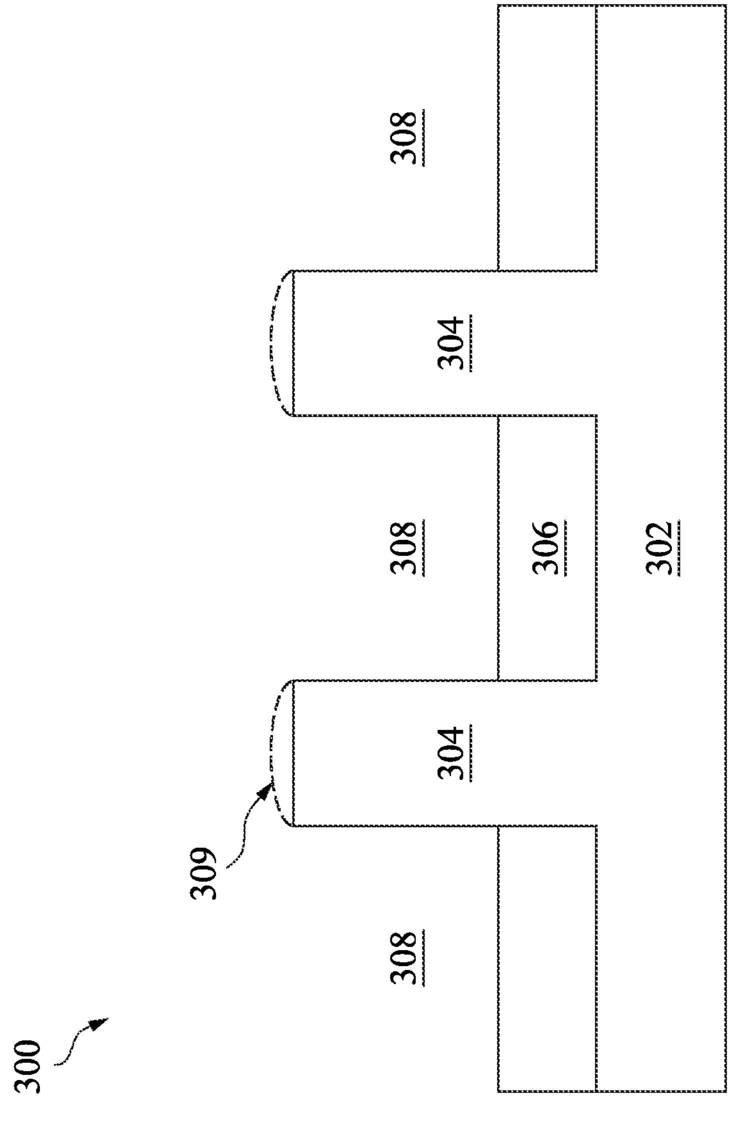
FIGS. 3, 4, 7, 9, 12, and 15 illustrate cross-sectional views of an example FinFET device (or a portion of the example FinFET device) analogous to the example FinFET device of FIG. 1 along line B-B during various fabrication stages of the example method of FIG. 2, in accordance with some embodiments of the present disclosure.

Referring to FIGS. 2 and 3, the method 200 at operation 202 provides a substrate 302 of the device 300. The substrate 302 may be a semiconductor substrate, such as a bulk semiconductor, a semiconductor-on-insulator (SOI) substrate, or the like, which may be doped (e.g., with a P-type or an N-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Still referring to FIGS. 2 and 3, the method 200 at operation 204 forms a (semiconductor) fin 304 to protrude or extend vertically from the substrate 302. Although two fins 304 are shown in the illustrated embodiment of FIG. 4 (and the subsequent figures), it should be appreciated that the device 300 can include any number of the fins 304 while remaining within the scope of the present disclosure. In some embodiments, the fins 304 are formed by patterning the substrate 302 using, for example, photolithography and etching techniques. For example, a mask layer (not depicted), including a pad oxide layer and an overlying pad nitride layer, is formed over the substrate 302. The pad oxide layer may be a thin film comprising silicon oxide formed, for example, using a thermal oxidation process. The pad oxide layer may act as an adhesion layer between the substrate 302 and the overlying pad nitride layer. In some embodiments, the pad nitride layer is formed of silicon nitride, silicon oxynitride, silicon carbo nitride, the like, or combinations thereof. The pad oxide layer and the pad nitride layer may each be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not depicted) that is deposited, irradiated (or exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask, which is subsequently used to pattern exposed portions of the substrate 302 to form trenches 308, thereby defining the fins 304 separated by the trenches 308 as depicted in FIG. 3. When multiple fins are formed, such a trench 308 may be disposed between any two adjacent fins 304. In some embodiments, the fins 304 are formed by etching the trenches 308 in the substrate 302 using, for example, reactive ion etch (RIE), neutral beam etch (NBE), the like, or combinations thereof. The etching may be anisotropically implemented. In some embodiments, the trenches 308 may be strips (viewed from the top) parallel to each other, and closely spaced with respect to each other. In some embodiments, the trenches 308 may be continuous and surround each fin 304. In this regard, though not depicted herein, a top surface of the resulting fins 304 is overlaid with the patterned mask until a subsequent fabrication step removes it.

The fins 304 may be patterned by other suitable methods. In one example, the fins 304 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not depicted) is formed over the substrate 302 and patterned using a photolithography process. Spacers (not depicted) are formed alongside the patterned sacrificial layer using a self-aligned process. The sacrificial layer is then removed, and the remaining spacers, or mandrels, may then be used to pattern the fins 304.

In another example, a top portion of the substrate 302 may be replaced by or overlaid with a suitable material, such as an epitaxial material (not depicted) suitable for an intended type (e.g., N-type or P-type) of semiconductor devices to be formed. The epitaxial material may be grown over the substrate 302 by any suitable epitaxial process. Thereafter, the substrate 302, with the epitaxial material provided over the top portion, is patterned by a photolithography process described herein, for example, to form the fins 304 that include the epitaxial material.

Still referring to FIGS. 2 and 3, the method 200 at operation 206 forms isolation regions 306 over the substrate 302 to surround bottom portions of the fins 304. The isolation regions 306, which are formed of a dielectric (or insulating) material, can electrically isolate neighboring fins 304 from one another. The dielectric material may include an oxide, such as silicon oxide (SiO and/or $SiO_2$), a nitride, the like, or combinations thereof, and may be formed by a high density plasma chemical vapor deposition (HDPCVD), a flowable CVD (FCVD) (e.g., a CVD-based material deposition in a remote plasma system, followed by an annealing or curing process to densify the deposited material into another material, such as an oxide), spin coating, the like, or combinations thereof. Other dielectric materials and/or other formation processes may be used to form the isolation regions 306. In the depicted embodiments, the dielectric material of the isolation regions 306 include silicon oxide formed by a FCVD process. An annealing process may be performed once the dielectric material is deposited. A planarization process, such as a chemical-mechanical polish/planarization (CMP) process, may remove any excess dielectric material, such that a top surface of the dielectric material and the top surface of the fins 304 that are substantially coplanar. The patterned mask over the top surface of the fins 304 may also be removed by the planarization process.

Subsequently, the dielectric material is recessed to form the isolation regions 306 in the trenches 308, as depicted in FIG. 3. In some embodiments, the isolation regions 306 include shallow trench isolation (STI) features. The isolation regions 306 are recessed such that the upper portions of the fin 304 protrude from between neighboring isolation regions 306. Respective top surfaces of the isolation regions 306 may have a flat surface (as depicted), a convex surface, a concave surface (such as dishing), or combinations thereof. The top surfaces of the isolation regions 306 may be formed such profile(s) by any suitable etching process, such as one that is selective to the material of the isolation regions 306 with respect to the substrate 302 (and the fins 304). For example, a dry etching process or a wet etching process using dilute hydrofluoric (DHF) acid may be performed to recess the dielectric material to form the isolation regions 306.

As another example of forming the fins 304 and the isolation regions 306, a dielectric layer (not depicted) may be formed over the top surface of the substrate 302; trenches may be etched through the dielectric layer; homoepitaxial structures may be epitaxially grown in the trenches; and the dielectric layer may be recessed such that the homoepitaxial structures protrude from the dielectric layer to form the fins 304. In yet another example, a dielectric layer (not depicted) may be formed over the top surface of the substrate 302; trenches may be etched through the dielectric layer; heteroepitaxial structures may be epitaxially grown in the trenches using a material different from the substrate 302; and the dielectric layer may be recessed such that the heteroepitaxial structures protrude from the dielectric layer to form the fins 304.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an N-type device region (e.g., a region configured to provide an N-type metal oxide-semiconductor, or NMOS, device) different from the material in a P-type device region (e.g., a region configured to provide a P-type MOS, or PMOS, device). In various embodiments, the fins 304 may include silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In some embodiments, as depicted by the solid line in FIG. 3, the top surface of each fin 304 is substantially flat, i.e., parallel to a top surface of the substrate 302. In some embodiments, as depicted by the dashed curve in FIG. 3, the top surface of each fin 304 has a curved (or rounded) profile 309, which may be a convex profile resulting from the various etching processes implemented during the formation of the fins 304, the isolation regions 306, and/or other components of the device 300. In some embodiments, the curved profile 309 may include a plurality of connected facets corresponding to various crystallographic planes (e.g., (100), (110), and (111)) of the crystalline lattice of the semiconductor material (e.g., silicon) included in the fins 304.

Figure 4:
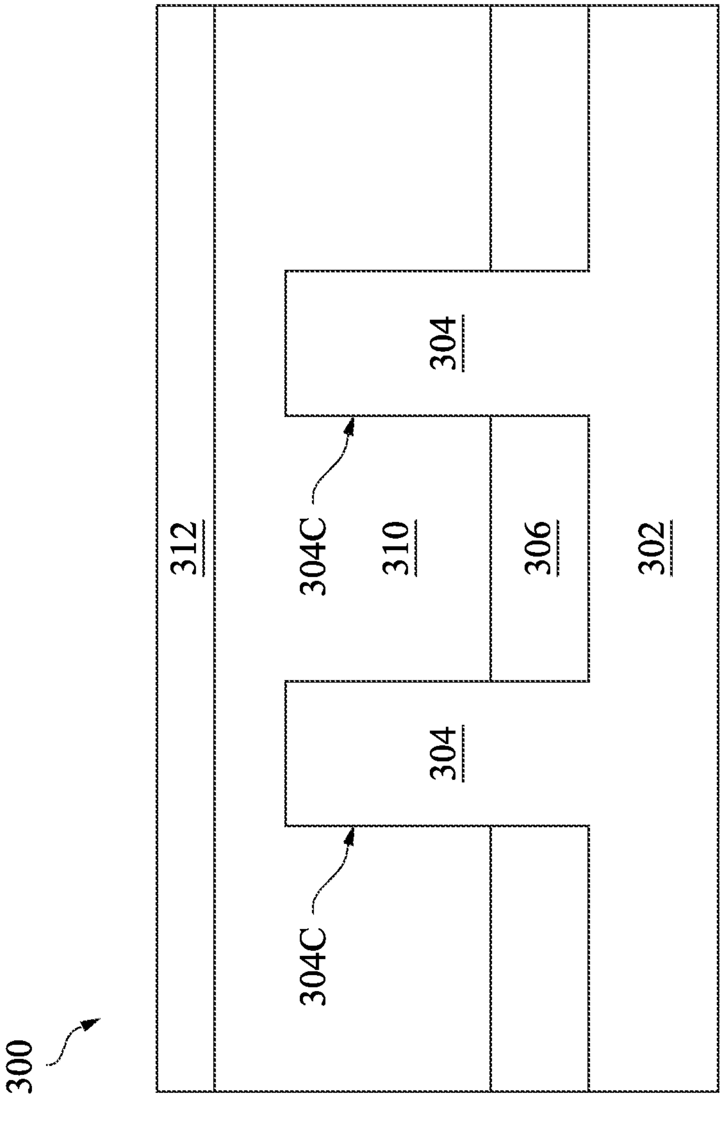
Figure 5:
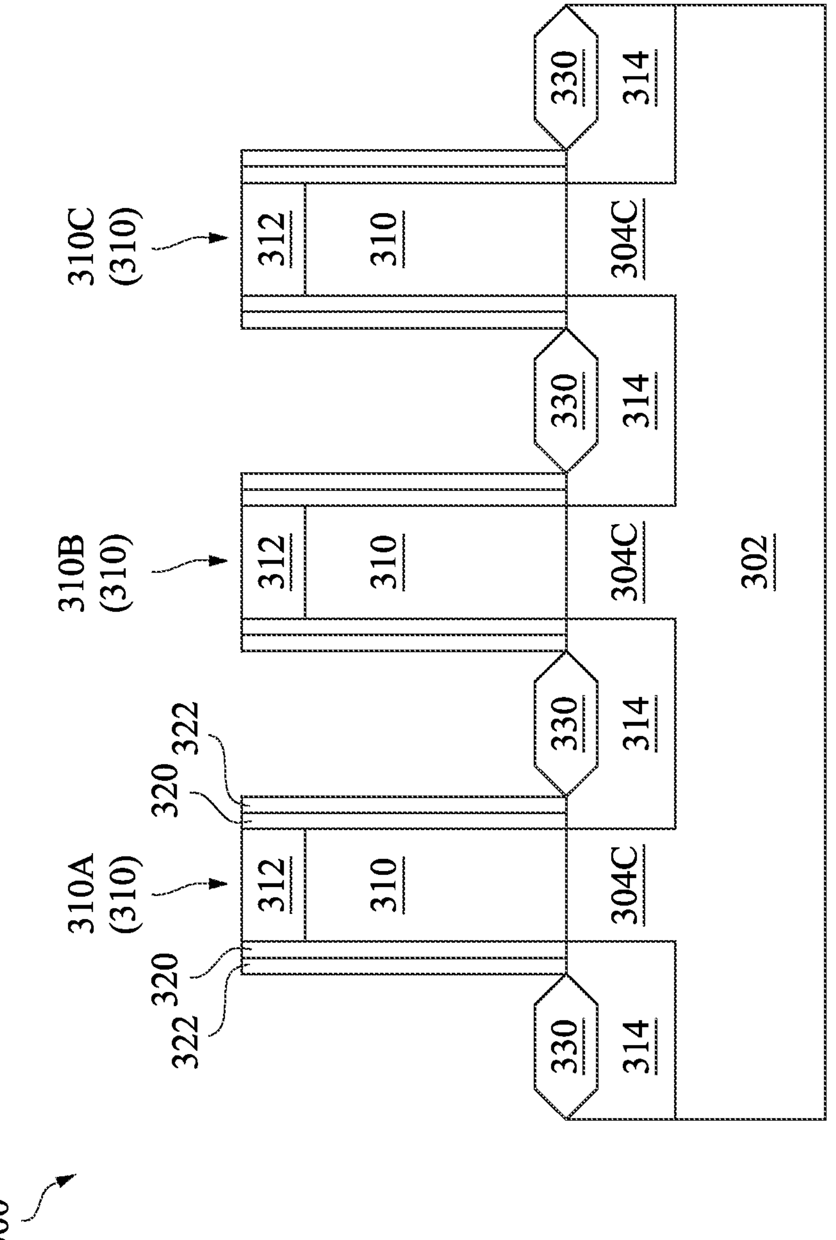
FIGS. 5, 6, 8, 10, 13, 16, and 17 illustrate cross-sectional views of an example FinFET device (or a portion of the example FinFET device) analogous to the example FinFET device of FIG. 1 along line A-A during various fabrication stages of the example method of FIG. 2, in accordance with some embodiments of the present disclosure.

Referring to FIGS. 2, 4, and 5, the method 200 at operation 208 forms a dummy gate structure 310 (e.g., dummy gate structures 310A, 310B, and 310C) over a channel region 304C of each fin 304. The dummy gate structure 310 may include a dummy gate dielectric over the fins 304 and a dummy gate electrode (not depicted separately) over the dummy gate dielectric layer (not depicted separately), in some embodiments. The dummy gate structure 310 may optionally include an interfacial layer between the fins 304 and the dummy gate dielectric layer, where the interfacial layer may include an oxide, such as silicon oxide. The gate dielectric layer may include any suitable dielectric material, such as silicon oxide, silicon nitride, multilayers thereof, or the like. The dummy gate electrode may include polysilicon.

Various layers of the dummy gate structure 310 may be deposited as blanket layers over the fins 304 by any suitable process, such as CVD, atomic layer deposition (ALD), or physical vapor deposition (PVD), thermally grown, or chemically grown, and then planarized by a CMP process, for example. A mask layer including silicon nitride or the like may be deposited over the various blanket layers of the dummy gate structure 310. The mask layer may be patterned using a series of photolithography and etching processes to form the mask 312. The pattern of the mask 312 may then be transferred to the blanket layers using any suitable etching processes to form the dummy gate structure 310. The dummy gate structure 310 traverses or covers a portion, e.g., the channel region 304C, of each fin 304, where a lengthwise direction of the dummy gate structure 310 (e.g., along the line B-B of FIG. 1) is substantially perpendicular to a lengthwise direction of the fins 304 (e.g., the line A-A of FIG. 1).

As depicted in FIG. 5, three dummy gate structures 310A, 310B, and 310C are formed over the channel region 304C of each fin 304, which are collectively referred to as the dummy gate structure 310. It should be appreciated that more or less than three dummy gate structures 310 can be formed over the fins 304 while remaining within the scope of the present disclosure.

Referring to FIGS. 2 and 5, the method 200 at operation 210 forms a number of lightly doped drain (LDD) regions 314 in the fins 304. The LDD regions 314 may be formed by a plasma doping process. The plasma doping process may include forming a patterned mask (not depicted), such as a patterned photoresist, to cover the regions of the device 300 that are to be protected from the plasma doping process. The plasma doping process may implant N-type or P-type impurities (or dopants) in the fins 304 to form the LDD regions 314. For example, P-type impurities, such as boron, indium, and/or the like, may be implanted in the fins 304 to form the LDD regions 314 for a P-type device (e.g., a PMOS device). In another example, N-type impurities, such as phosphorus, arsenic, and/or the like, may be implanted in the fins 304 to form the LDD regions 314 for an N-type device (e.g., an NMOS device). In some embodiments, the LDD regions 314 abut one of the channel regions 304C of the device 300 (e.g., the central portion of the fin 304 overlaid by one of the dummy gate structures 310). Portions of the LDD regions 314 may extend under the dummy gate structure 310 and into the channel regions 304C of the device 300. FIG. 5 depicts a non-limiting example of the LDD regions 314. Other configurations, shapes, and formation methods of the LDD regions 314 may also be possible and are fully intended to be included within the scope of the present disclosure. For example, the LDD regions 314 may be formed after gate spacers 320/322, which will be discussed below, are formed. In some embodiments, the LDD regions 314 are omitted from the device 300.

Still referring to FIG. 5, after forming the LDD regions 314, in some embodiments, first gate spacers 320 are formed around (e.g., along and contacting the sidewalls of) the dummy gate structures 310, and second gate spacers 322 are formed around (e.g., along and contacting the sidewalls of) the first gate spacers 320. For example, the first gate spacers 320 may be formed on opposing sidewalls of the dummy gate structure 310, and the second gate spacers 322 may be formed on the first gate spacers 320. It should be understood that any number of gate spacers can be formed around the dummy gate structures 310 while remaining within the scope of the present disclosure.

The first gate spacers 320 may be a low-k (e.g., having a dielectric constant less than that of silicon oxide, which is about 3.9) spacer and may include a suitable dielectric material, such as silicon oxide, silicon oxycarbonitride, the like, or combinations thereof. The second gate spacers 322 may include a suitable dielectric material, such as silicon nitride, silicon oxynitride, silicon carbonitride, the like, or combinations thereof. In accordance with various embodiments, the first gate spacers 320 and the second gate spacers 322 include different materials to provide etching selectivity therebetween in subsequent processing. The first gate spacers 320 and the second gate spacers 322 may be formed by first conformally depositing a dielectric layer over the dummy gate structures 310 using any suitable deposition process, such as thermal oxidation, CVD, or the like, and subsequently removing portions of the dielectric layer using a suitable etching process (e.g., a directional or anisotropic dry etching process), leaving behind the first gate spacer 320 and the second gate spacer 322 along the sidewalls of the dummy gate structures 310. The first gate spacer 320 and the second gate spacer 322 may sometimes be collectively referred to as gate spacers 320/322.

The shapes and formation methods of forming the gate spacers 320/322 as illustrated in FIG. 5 (and the following figures) are merely non-limiting examples, and other shapes and formation methods are possible. These and other variations are fully intended to be included within the scope of the present disclosure.

Still referring to FIGS. 2 and 5, the method 200 at operation 212 forms source/drain regions 330 in the fins 304. The source/drain regions 330 include semiconductor materials doped with one or more impurities according to the type of device desired. For example, the source/drain regions 330 may include silicon (Si) or silicon carbon (SiC) doped with an N-type impurity, such as phosphorous, arsenic, and/or the like, to form an N-type device (e.g., an NMOS device). The source/drain regions 330 may include silicon germanium (SiGe) doped with a P-type impurity, such as boron, indium, and/or the like, to form a P-type device (e.g., a PMOS device).

The source/drain regions 330 may be formed by first etching the fins 304 to form recesses (not depicted) adjacent to each dummy gate structure 310 by any suitable etching process, such as a dry etching process. For example, the recesses may be formed by an anisotropic dry etching process using the dummy gate structures 310 as an etching mask. Then, the source/drain regions 330 are formed in the recesses by epitaxially growing a semiconductor material (e.g., Si, SiC, or SiGe) from the fins 304 exposed in the recesses, using any suitable methods such as metal-organic CVD (MOCVD), molecular beam epitaxy (MBE), liquid phase epitaxy (LPE), vapor phase epitaxy (VPE), selective epitaxial growth (SEG), the like, or combinations thereof. The resulting source/drain regions 330 and the dummy gate structures 310 are alternately arranged, where each dummy gate structure 310 is interposed between a pair of adjacent source/drain regions 330 along the lengthwise direction of each fin 304 (e.g., the line A-A as depicted in FIG. 1).

As depicted in FIG. 5, the epitaxial source/drain regions 330 may have top surfaces raised from surfaces of the fin 304 (e.g. raised above the non-recessed portions of the fin 304) and may have facets oriented along different crystallographic planes. In some embodiments, the source/drain regions 330 of the adjacent fins 304 may merge to form a continuous epitaxial source/drain region (not depicted) along the lengthwise direction of the dummy gate structure 310. In some embodiments, the source/drain regions 330 of the adjacent fins 304 may instead remain separate source/drain regions 330 (not depicted).

The source/drain regions 330 may be implanted with one or more suitable dopants using a process that may include forming and patterning masks, such as a photoresist, to cover the regions of the device 300 that are to be protected from the implanting process. The source/drain regions 330 may have an impurity (e.g., dopant) concentration in a range of about $1\times10^{19}$ $cm^{-3}$ to about $1\times10^{21}$ $cm^{-3}$. P-type impurities, such as boron or indium, may be implanted in the source/drain regions 330 of a P-type device. N-type impurities, such as phosphorous or arsenide, may be implanted in the source/drain regions 330 of an N-type device. In some embodiments, the epitaxial source/drain regions 330 may be doped in situ while epitaxially growing the semiconductor materials in the recesses. An annealing process may be applied after doping the semiconductor materials to activate the impurities.

Figure 6:
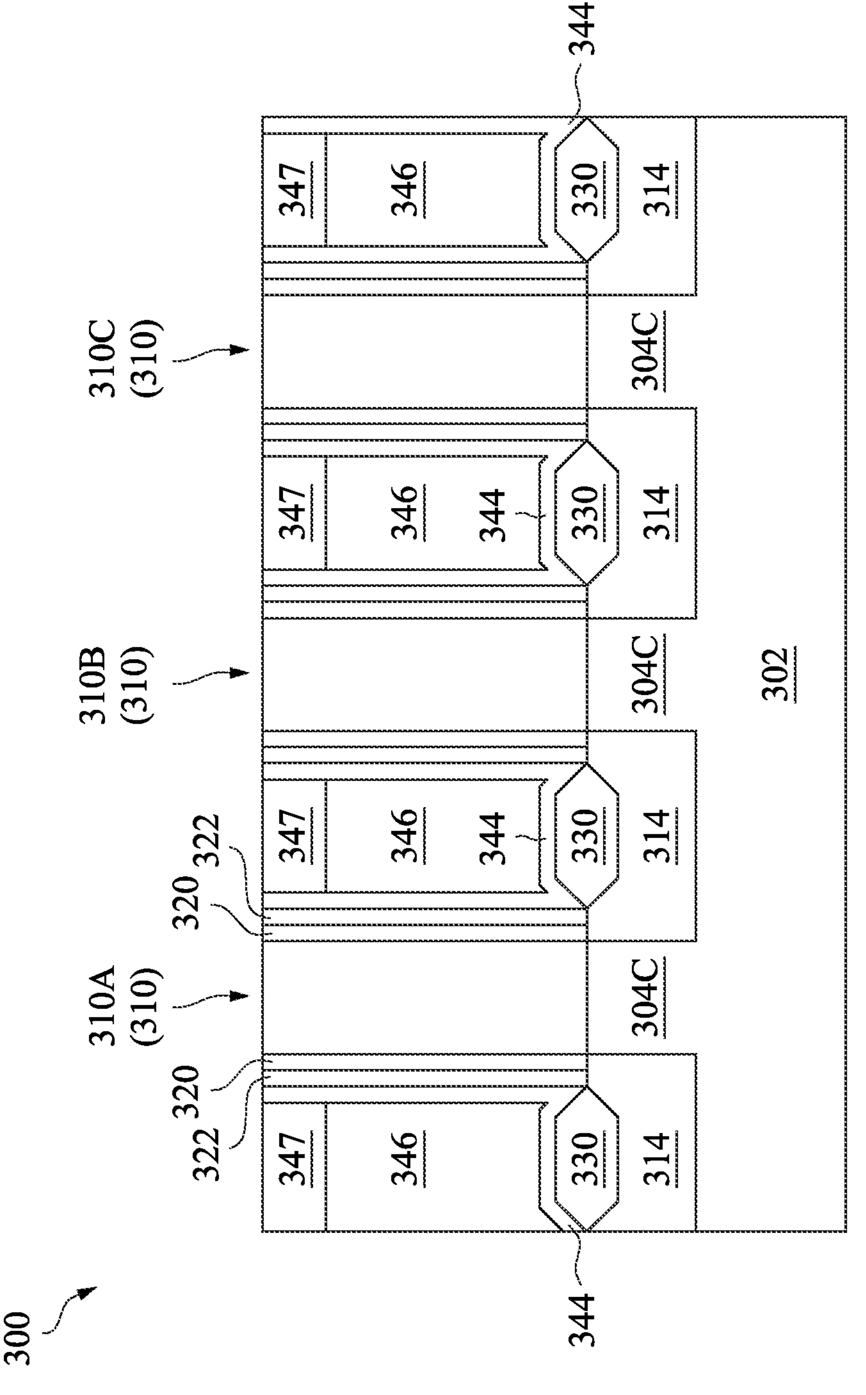

Referring to FIGS. 2 and 6, the method 200 at operation 214 forms an interlayer dielectric (ILD) layer 346 over the source/drain regions 330 and adjacent the dummy gate structures 310. In some embodiments, prior to forming the ILD layer 346, a contact etch stop layer (CESL) 344 is formed over the device 300 as illustrated in FIG. 6. The ILD layer 346 and CESL 344 include different materials to provide etching selectivity therebetween in subsequent fabrication processes. The CESL 344 may include any suitable dielectric material such as silicon nitride, silicon oxynitride, silicon oxide, the like, or combinations thereof, and may be formed by a suitable formation method such as CVD, ALD, PVD, the like, or combinations thereof.

Next, the ILD layer 346 is formed over the CESL 344 and over the dummy gate structures 310. In some embodiments, the ILD layer 346 includes any suitable dielectric material, such as silicon oxide, a low-k dielectric material, phosphosilicate glass (PSG), borosilicate glass (BSG), boron-doped phosphosilicate glass (BPSG), undoped silicate glass (USG), the like, or combinations thereof, and may be deposited by any suitable method, such as CVD, PECVD, FCVD, or the like. After the ILD layer 346 is formed, a dielectric layer 347 is formed over the ILD layer 346. The dielectric layer 347 may function as a protection layer to prevent or reduce the loss of the ILD layer 346 in subsequent etching processes. In this regard, the dielectric layer 347 and the ILD layer 346 may include different compositions to enhance the etching selectivity therebetween. The dielectric layer 347 may be formed of a suitable material, such as silicon nitride, silicon carbonitride, the like, or combinations thereof using a suitable method such as CVD, PECVD, FCVD, or the like. After the dielectric layer 347 is formed, a planarization process, such as a CMP process, may be performed to achieve a leveled top surface for the dielectric layer 347. The CMP process may also remove the mask 312 and portions of the CESL 344 disposed over the dummy gate structures 310. After the planarization process, the top surface of the dielectric layer 347 is substantially coplanar with the top surface of the dummy gate structures 310 as depicted herein.

An example replacement gate process (sometimes referred to as a gate-last process) is performed thereafter to replace each of the dummy gate structures 310 with a metal gate structure (which may also be referred to as a replacement gate structure or an active gate structure).

Figure 7:
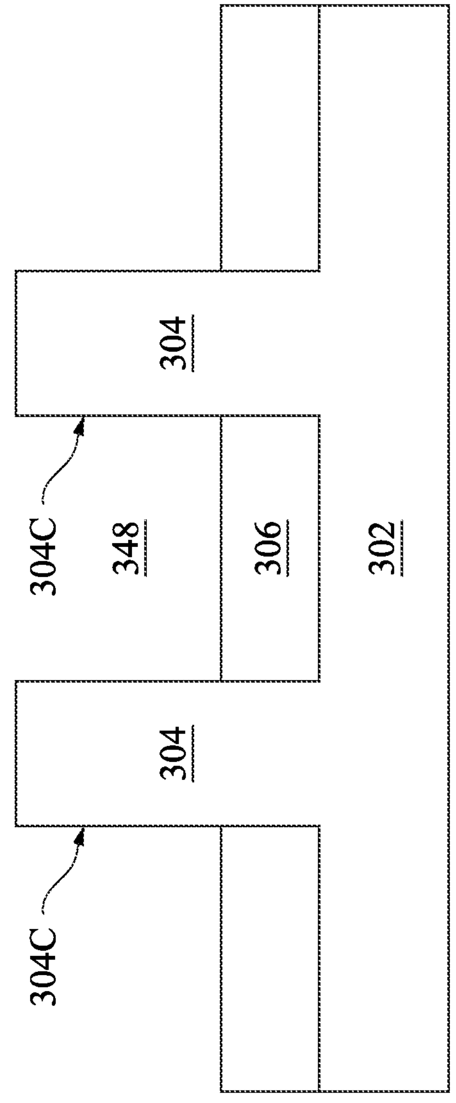
Figure 8:
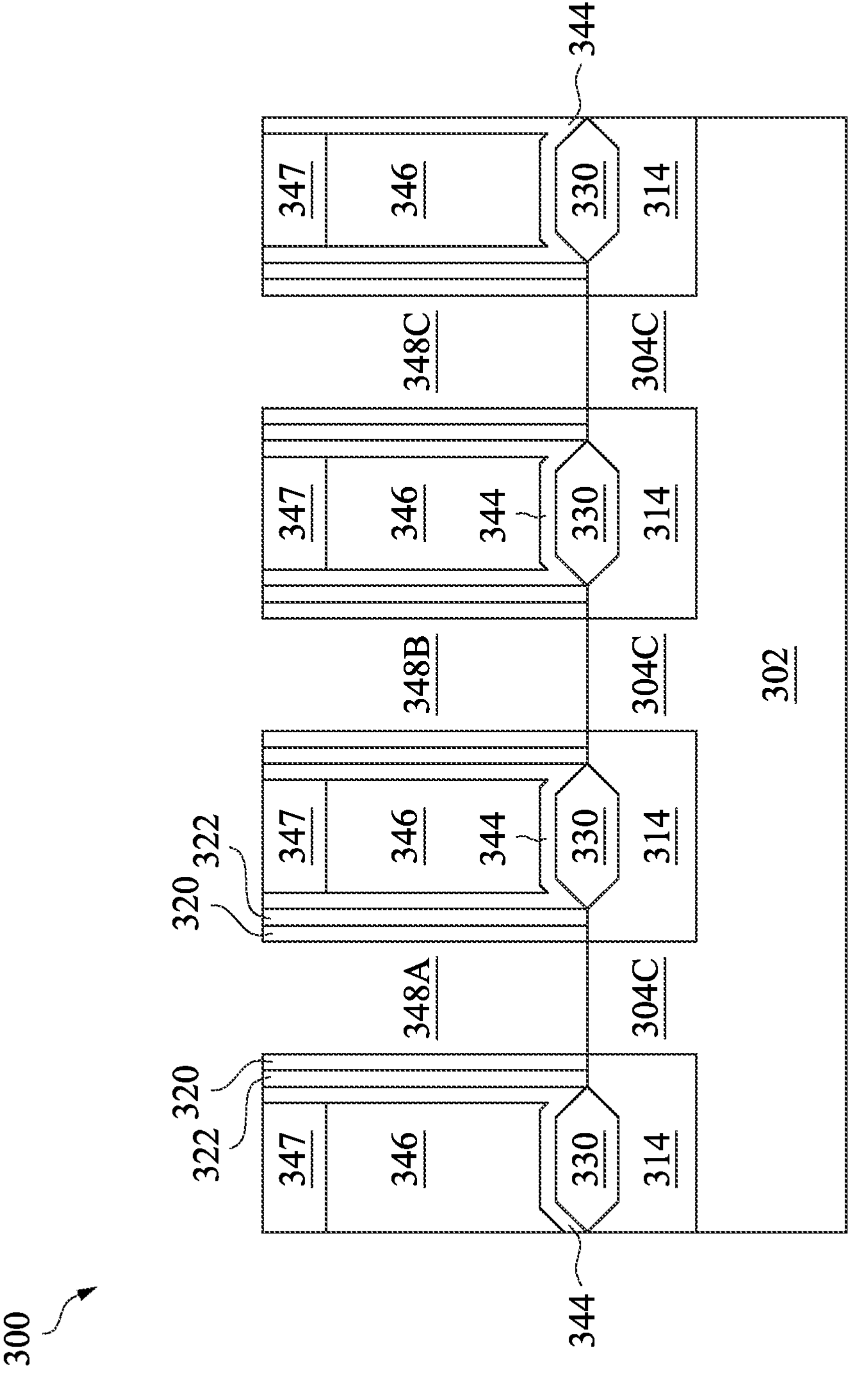

Referring to FIGS. 2, 7, and 8, the method 200 at operation 216 removes the dummy gate structures 310 (e.g., 310A, 310B, and 310C) to form gate trenches 348A, 348B, and 348C, which may collectively be referred to as the gate trenches 348 for purposes of simplicity. In some embodiments, the dummy gate structures 310 are removed by one or more etching steps, so that the gate trenches 348 are formed between the respective first gate spacers 320. Each gate trench 348 exposes the channel region 304C of each fin 304. In some examples, top portions of the first gate spacers 320, the second gate spacers 322, or both may be removed (or shortened) by a suitable etching process to expose top portions of the ILD layer 346.

Referring to FIGS. 9-17 collectively, the method 200 at operations 218-222 forms a metal gate structure 360 (e.g., 360A, 360B, and 360C) in each of the gate trenches 348 (e.g., 348A, 348B, and 348C, respectively) and between the corresponding first gate spacers 320.

Figure 9:
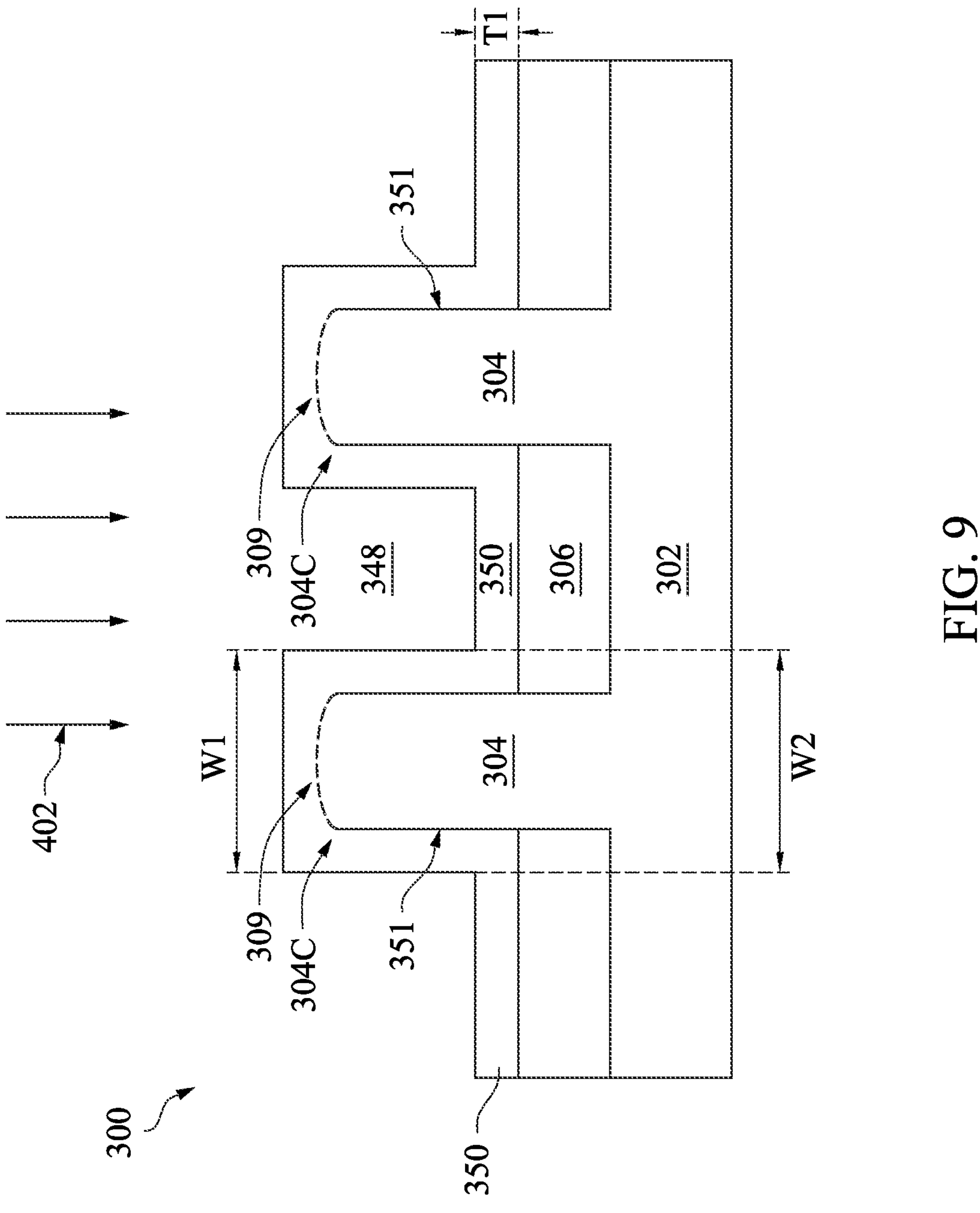
Figure 10:
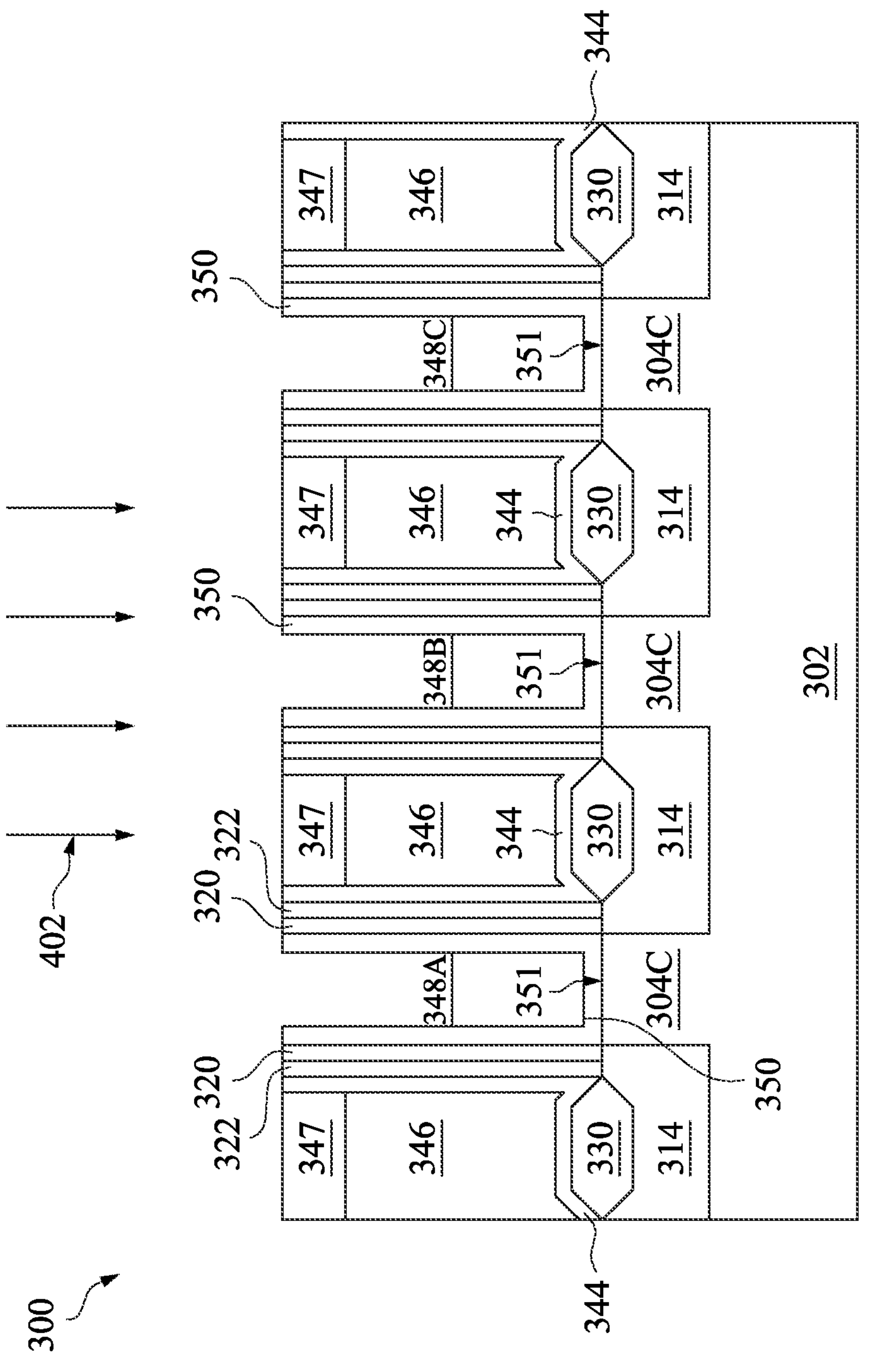

Referring to FIGS. 2, 9, and 10, the method 200 at operation 218 forms a first silicon oxide layer (also referred to as the first dielectric layer or the first oxide layer) 350 over the exposed channel region 304C in each gate trench 348. In the present embodiments, the first silicon oxide layer 350 includes SiO and/or $SiO_2$ and is formed conformally to overlay the exposed channel region 304C of each fin 304 as well as the top surfaces of the isolation regions 306. As depicted in FIG. 10, the first silicon oxide layer 350 is formed to extend horizontally along the channel region 304C and vertically along the first gate spacers 320, such that the resulting first silicon oxide layer 350 is configured with a U-shape in each gate trench 348. In some embodiments, the first silicon oxide layer 350 constitutes a portion of a gate dielectric layer of a subsequently-formed metal gate structure.

In the present embodiments, the first silicon oxide layer 350 is formed by a deposition process 402 that forms the first silicon oxide layer 350 one atomic layer at a time using a plasma-enhanced atomic layer deposition (PEALD) process. In other words, the first silicon oxide layer 350 is formed from a plurality of atomic layers of a silicon oxide material. In the present embodiments, the PEALD process uses a precursor gas that includes bis(diethylamino)silane (also referred to as SAM24), which has a molecular formula of $C_8H_{22}N_2Si$ as shown in Formula I below.

Formula I

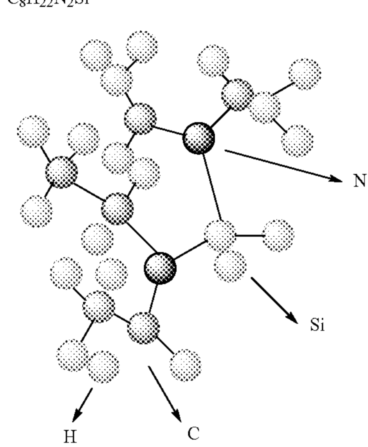

Figure 11:
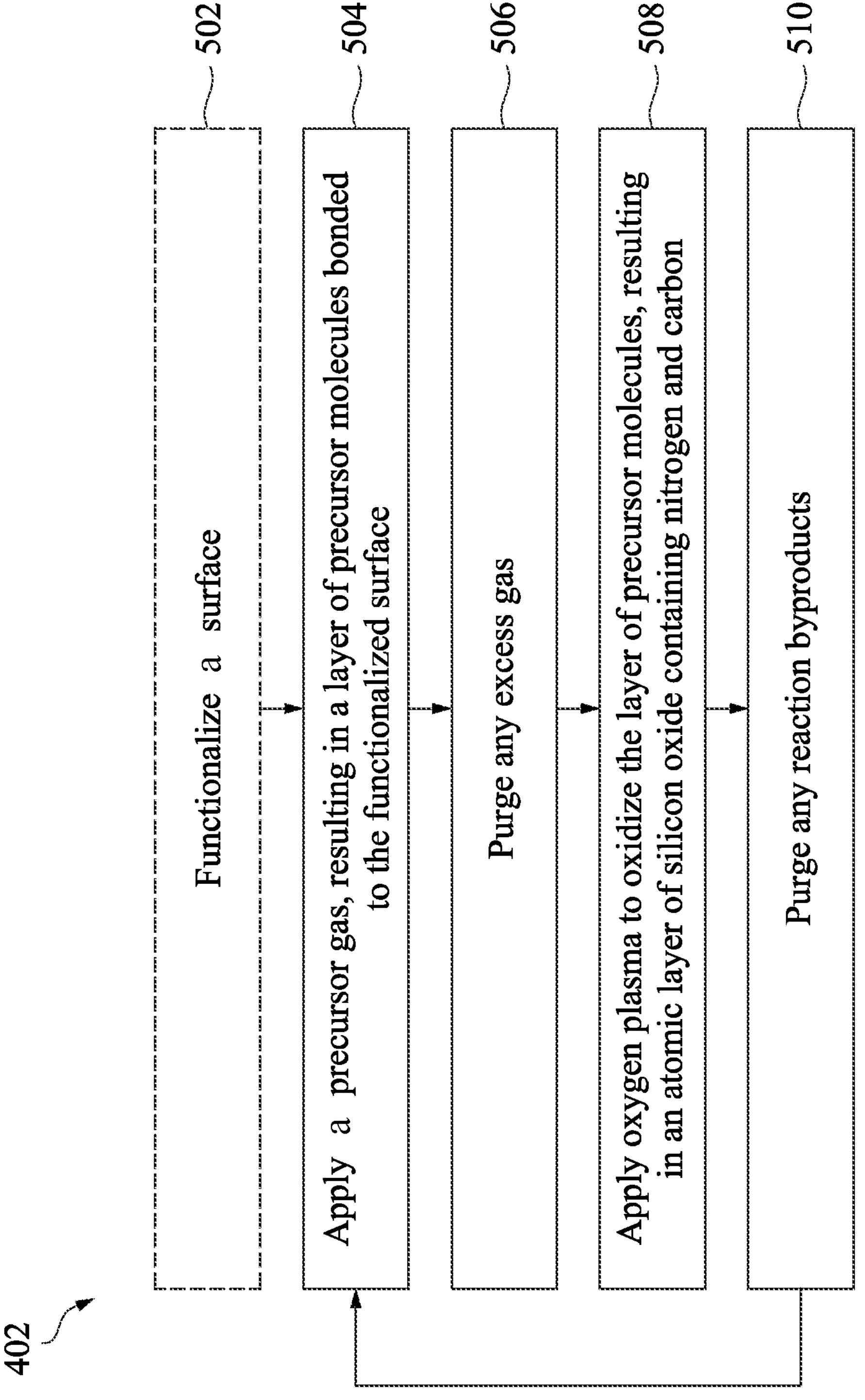
FIG. 11 illustrates a flow chart of an example method for making a portion of an example non-planar transistor, in accordance with some embodiments of the present disclosure.

Referring to FIG. 11, the deposition process 402 includes operations 502-510 as depicted and uses the precursor gas SAM24 to form the first silicon oxide layer 350 (see FIGS. 9 and 10) that includes a plurality of atomic layers of silicon oxide. For example, at operation 502, the exposed channel regions 304C and/or the top surfaces of the isolation regions 306 in the device 300 may be functionalized with, for example, hydroxyl (—OH) groups, to activate the surface in preparation for the introduction of the precursor gas SAM24. In some examples, operation 502 may be omitted. At operation 504, the deposition process 402 applies the precursor gas SAM24 to the device 300 in a reaction chamber, resulting in a layer of precursor molecules coupled to the functionalized surface of the device 300. As shown in Formula I above, each molecule of the precursor gas SAM24 includes nitrogen, carbon, hydrogen, and silicon. At operation 506, any excess precursor gas is purged using an inert gas (e.g., Ar). At operation 508, the deposition process 402 applies an oxygen plasma to chemically react with and subsequently oxidize the layer of precursor molecules, resulting in an atomic layer of nitrogen-and-carbon-containing silicon oxide (hereafter referred to as the atomic silicon oxide layer). In the present embodiments, the concentration of oxygen in the atomic silicon oxide layer of the first silicon oxide layer 350 is greater than the concentration of nitrogen and carbon, respectively. At operation 510, any reaction byproducts are removed from the reaction chamber by another purging process.

Thereafter, the deposition process 402 repeats operations 504-510 to form additional atomic silicon oxide layers over the fins 304 and the isolation regions 306 until the resulting first silicon oxide layer 350 reaches a thickness T1, as depicted in FIG. 9. In some examples, the thickness T1 may range from about 20 angstroms to about 50 angstroms, though other values may also be applicable to various embodiments of the present disclosure.

In the present embodiments, referring to FIGS. 9 and 10, a bottom portion of the first silicon oxide layer 350 directly (i.e., physically) contacts the channel region 304C at a first interface 351, which traverses along sidewalls and a top surface of the fin 304. Due to the crystalline structure of the semiconductor material, the formation of the fin 304 described herein can expose different crystallographic planes of the fin 304 (i.e., lattice of atoms oriented in different crystallographic planes) at the first interface 351. For example, as described above, the top surface of each fin 304 may be defined by the curved profile 309, which includes a plurality of connected facets corresponding to various crystallographic planes of the material of the fin 304. In the case of silicon, the crystallographic planes typically exposed at the first interface 351 include {100}, {110}, and {111}, such as (100), (110), and (111).

For existing implementations in which a silicon oxide layer (e.g., the first silicon oxide layer 350) is formed by a thermal oxidation process, the silicon oxide layer generally grows at different rates on different crystallographic planes at elevated processing temperatures. In one such example, the silicon oxide layer grows at a greater rate on the (111) plane than the (110) and the (100) planes, resulting in a top portion of the silicon oxide layer growing on the (111) plane being thicker than a bottom portion of the silicon oxide layer growing on the (110) and the (100) planes. Where the silicon oxide layer grows thicker, the fin may be thinner due to consumption of the fin 304 by the thermal oxidation process, leading to a non-uniform fin sidewall profile and concerns over device reliability. To mitigate this effect, a nitridation process, which introduces a flow of $N_2O$ and/or NO to the thermal oxidation process, may be implemented to ensure that the rates of growth of the silicon oxide layer are more closely matched between planes of different crystallographic orientations. However, the nitridation process can cause positive charges to accumulate at an interface (e.g., the first interface 351) between the silicon oxide layer and the underlying fin (e.g., the fin 304), thereby trapping charge carriers (e.g., electrons) in a channel region (e.g., the channel region 304C) of the device and subsequently increasing noise in the device.

In contrast, referring to FIGS. 9-11, growing the first silicon oxide layer 350 using the deposition process 402 such as a PEALD process, where the silicon oxide material is deposited one atomic layer at a time on all crystallographic planes, activation energy ($E_a$) of the oxidation reaction (e.g., the oxidation reaction at operation 508) is lower than that of a thermal oxidation reaction, resulting in a lowered sensitivity to processing temperatures and dependence on the underlying planes' crystallographic orientations. In other words, the rates of growth of the first silicon oxide layer 350 on various crystallographic planes are substantially similar. Accordingly, the first silicon oxide layer 350 grows more uniformly around the surfaces (e.g., the channel region 304C) of the fin 304, such that a width W1 in the top portion of the first silicon oxide layer 350 is similar to the width W2 in the bottom portion of the first silicon oxide layer 350. In some embodiments, referring to FIG. 9, a ratio of the width W2 to the width W1 is from about 0.9 to about 1.0. In some embodiments, a ratio of a thickness of the first silicon oxide layer 350 grown on the (100) plane to that grown on the (110) plane, a ratio of a thickness of the first silicon oxide layer 350 grown on the (100) plane to that grown on the (111) plane, and a ratio of a thickness of the first silicon oxide layer 350 grown on the (110) plane to that grown on the (111) plane are each about 0.9 to about 1.0.

However, as described herein, the precursor molecules (e.g., SAM24) implemented during the PEALD process include atoms such as nitrogen and carbon. In some instances, the nitrogen atoms in the first silicon oxide layer 350 may accumulate at the first interface 351 and result in trapping of the charge carriers in the channel region 304C, thereby giving rise to noise issues similar to the effect of nitridation on the thermal oxidation process described above.

Figure 12:
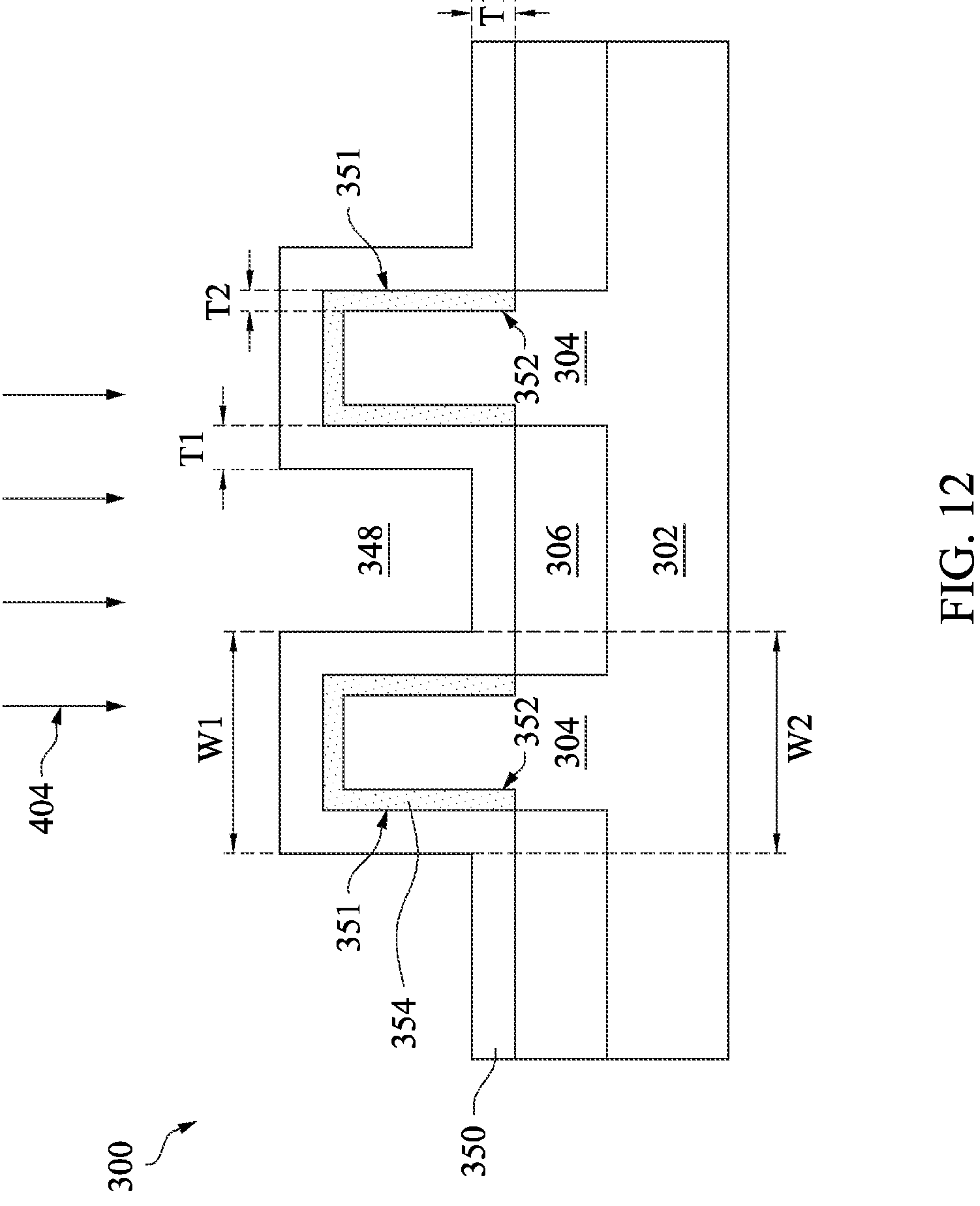
Figure 13:
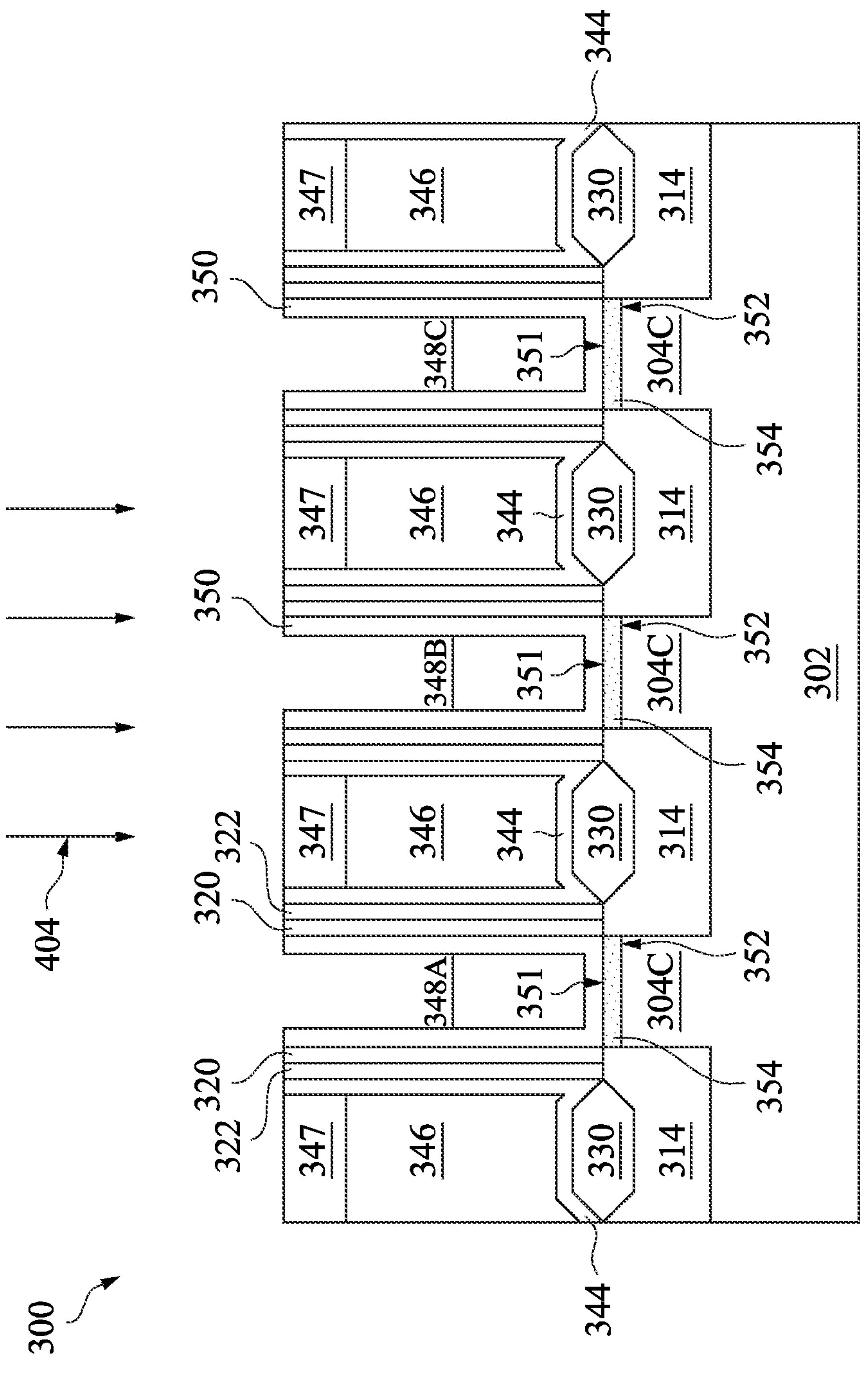

To remedy or reduce the effect of nitrogen atoms accumulating at the first interface 351, referring to FIGS. 2, 12, and 13, the method 200 further implements operation 220 to thermally grow a second silicon oxide layer (also referred to as the second dielectric layer or the second oxide layer) 354 over the fin 304 (i.e., the channel region 304C) at the first interface 351, such that the second silicon oxide layer 354 is embedded between the first silicon oxide layer 350 and the fin 304. The second silicon oxide layer 354 is formed by a thermal oxidation process 404, which may be an in-situ steam generation (ISSG) process according to some embodiments, though other thermal oxidation processes may also be applicable.

As shown in FIG. 12, the thermal oxidation process 404 provides oxygen in the form of steam, for example, that reacts with a portion of the fin 304 at the first interface 351 to form the second silicon oxide layer 354. The resulting second silicon oxide layer 354 traverses surfaces of the fin 304 (i.e., the channel region 304C) at a second interface 352. In this regard, the second silicon oxide layer 354 provides a barrier between the first silicon oxide layer 350 and the fin 304 that effectively shields positive charges from accumulating at the second interface 352 due to the presence of nitrogen atoms, thereby reducing noises associated with any trapped charges across the channel region 304C. In some embodiments, thermally growing the second silicon oxide layer 354 consumes a portion of the fin 304, such that the second interface 352 is vertically aligned with a sidewall of a lower portion of the fin 304 (e.g., adjacent the isolation regions 306) as depicted in FIG. 12. In the present embodiments, the second silicon oxide layer 354 is grown by the thermal oxidation process 404 from a bottom surface of the first silicon oxide layer 350 toward the substrate 302 as depicted in FIG. 13.

In the present embodiments, referring to FIG. 12, a lateral separation distance between the first interface 351 and the second interface 352 defines a thickness T2 of the second silicon oxide layer 354, which may range from about 10 angstroms to about 50 angstroms. If the thickness T2 is less than about 10 angstroms, then the effect of shielding the nitrogen atoms from accumulating at the second interface 352 is undermined and the noise issues associated with trapped charges are not remedied. On the other hand, if the thickness T2 is greater than about 50 angstroms, then the thickness T2 may be non-uniform over various crystallographic planes described in detail above. In this regard, the thickness T2 may be tuned to balance the reduction in noise issues at the second interface 352 and improvement in the overall uniformity of the thickness of the silicon oxide layers, i.e., the first silicon oxide layer 350 and the second silicon oxide layer 354 collectively. In some embodiments, the thickness T2 is less than or equal to the thickness T1. For example, a ratio of the thickness T2 to the thickness T1 may be about 0.2 to about 1.0. In some examples, the thickness T2 may be greater than the thickness T1, so long as the thickness T2 is tuned to within the range of about 10 angstroms to about 50 angstroms as described herein.

In some embodiments, the concentration of nitrogen and carbon, respectively, in the first silicon oxide layer 350 ranges from about 1E16 $cm^{-2}$ to about 1E17 $cm^{-2}$, although the present disclosure is not limited to such a range. After forming the second silicon oxide layer 354, the distribution of nitrogen atoms may be similar to the distribution of carbon atoms across both the first silicon oxide layer 350 and the second silicon oxide layer 354. In some embodiments, such distribution is approximated by a concentration profile 353 in a plot 420 of FIG. 14, which schematically describes changes in concentration of an element over depth. As shown, the concentration of nitrogen and carbon, respectively, has a maximum (or peak) M1 within the first silicon oxide layer 350 and gradually decreases across the second silicon oxide layer 354. In other words, the concentration of nitrogen and carbon, respectively, is greater in the first silicon oxide layer 350 than in the second silicon oxide layer 354.

In contrast, still referring to FIG. 14, the concentration of oxygen, approximated by a concentration profile 355, gradually increases across the first silicon oxide layer 350 and reaches a maximum (or peak) M2 within the second silicon oxide layer 354. In other words, the concentration of nitrogen (and carbon) is greater in the first silicon oxide layer 350 than in the second silicon oxide layer 354, while the concentration of oxygen is greater in the second silicon oxide layer 354 than in the first silicon oxide layer 350. Furthermore, comparing the concentration profile 353 with the concentration profile 355, the concentration of oxygen is greater than the concentration of nitrogen (or carbon) in both the first silicon oxide layer 350 and the second silicon oxide layer 354. In some embodiments, a ratio of the concentration of nitrogen (and carbon) in the first silicon oxide layer 350 to that in the second silicon oxide layer 354 is at least about 5.0. For example, if the concentration of nitrogen (or carbon) in the first silicon oxide layer 350 is about 1E17 $cm^{-2}$, then the concentration of nitrogen (or carbon) in the first silicon oxide layer 350 may be less than or equal to about 2E16 $cm^{-2}$.

In some embodiments, increasing the thickness T2 increases the barrier between the fin 304 and the first silicon oxide layer 350. In other words, increasing the thickness T2 effectively pushes the position of the maximum M1 farther away from the second interface 352, thereby weakening the effect of positive charges accumulating near the second interface 352. In some embodiments, adjusting the position of the maximum M1 toward a top (or outer) surface of the first silicon oxide layer 350 (i.e., toward an interface between the first silicon oxide layer 350 and the gate electrode 358) may help improve the reliability of the device 300. In the present embodiments, the thickness T2 is tuned to between about 10 angstroms and 50 angstroms as described in detail above.

Figure 15:
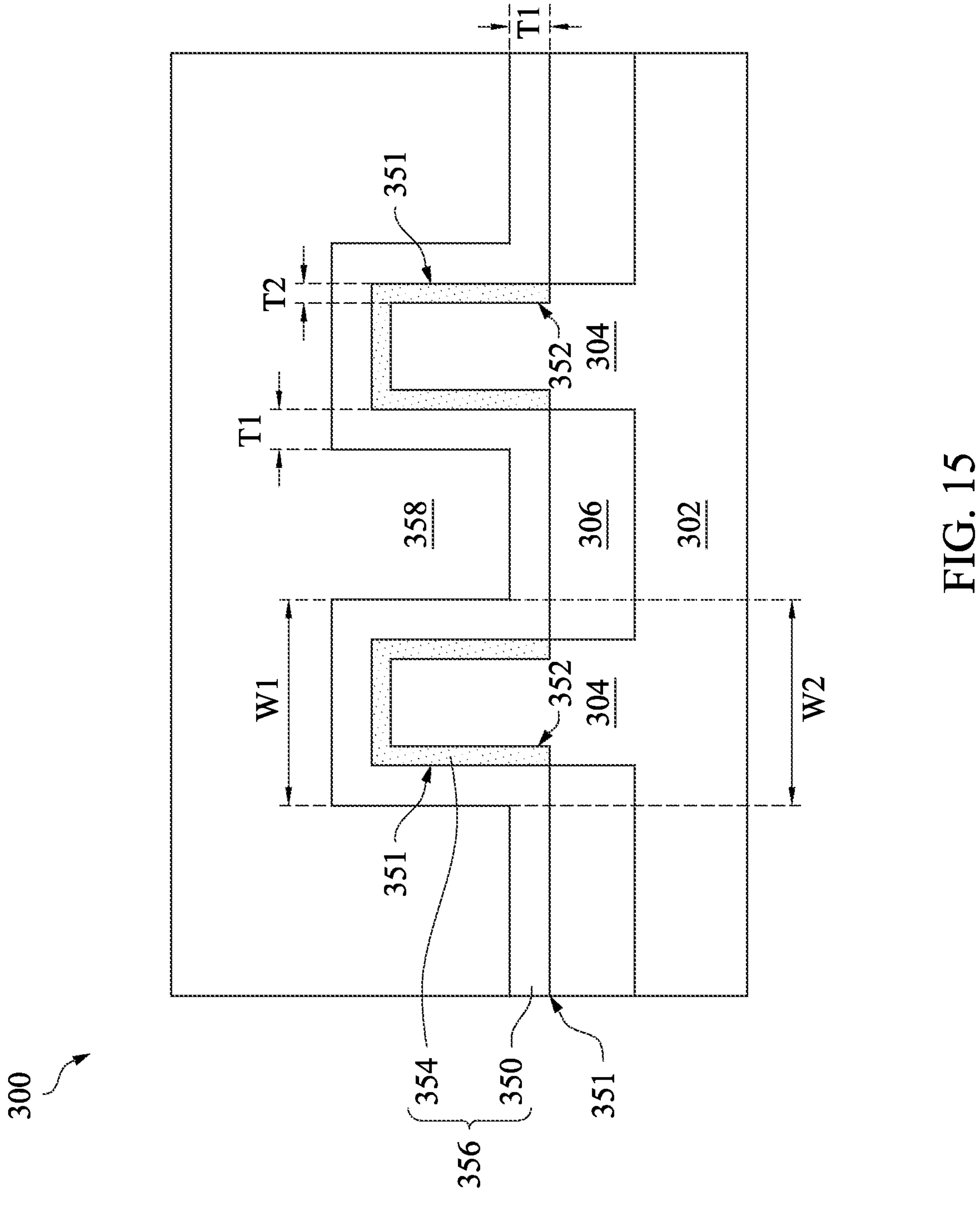
Figure 16:
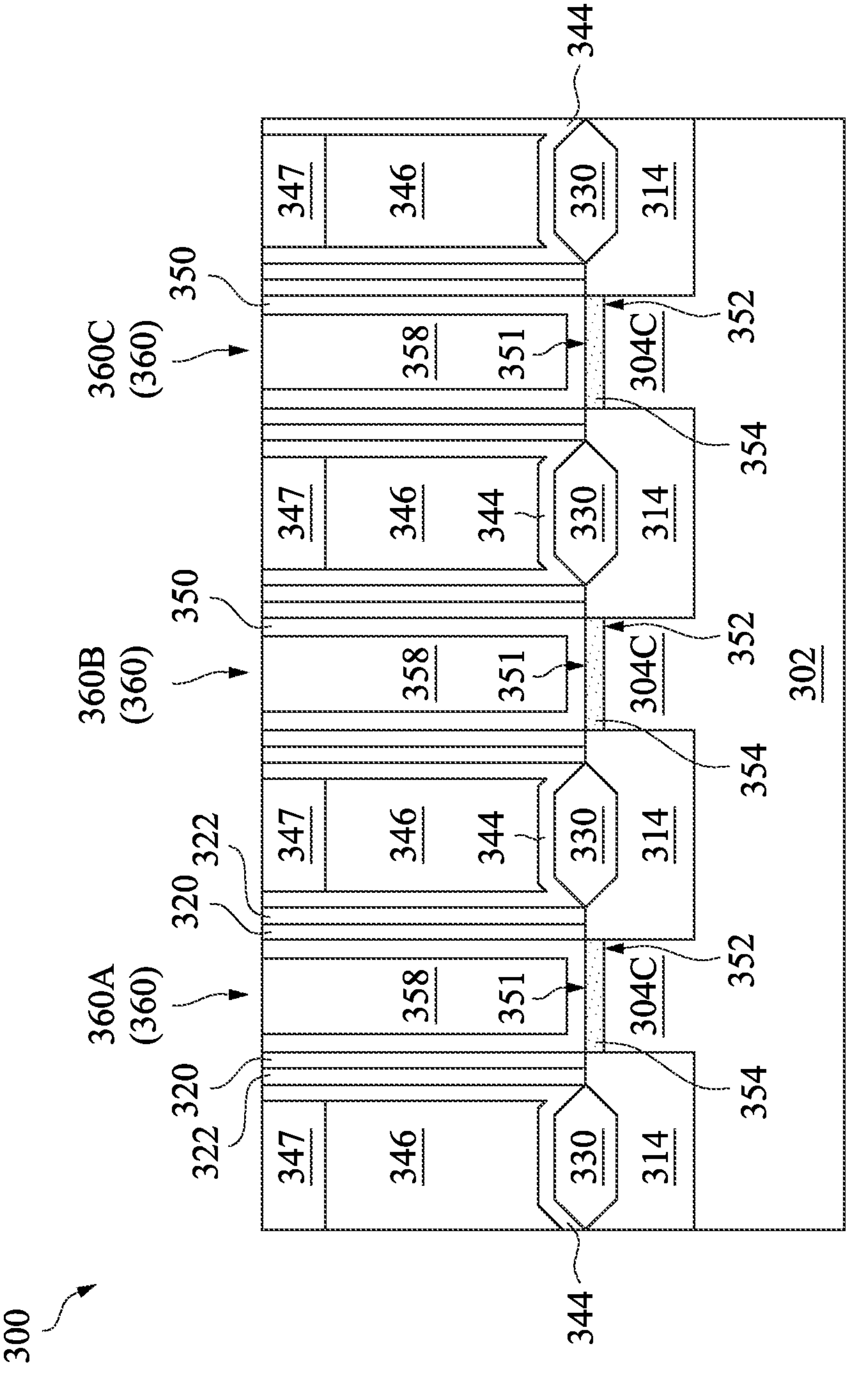

Referring to FIGS. 2, 15, and 16, the method 200 at operation 222 forms a gate electrode 358 over the first silicon oxide layer 350 and the second silicon oxide layer 354, which are together referred to as a gate dielectric layer 356, to form the metal gate structure 360 (e.g., 360A, 360B, and 360C) in each of the gate trenches 348 (e.g., 348A, 348B, and 348C, respectively). The gate electrode 358 may include any suitable metal, such as tungsten (W), copper (Cu), ruthenium (Ru), aluminum (Al), gold (Au), cobalt (Co). The gate electrode 358 may be formed by any suitable method, such as PVD, CVD, electroplating, electroless plating, the like, or combinations thereof, as a blanket layer over the gate dielectric layer 356 and subsequently planarized by a CMP process, for example, to expose a top surface of the first gate spacers 320 and the second gate spacers 322. While not depicted the gate electrode 358 may further include a barrier layer, a seed layer, the like, or combinations thereof. In one example, the barrier layer may include Ti, Ta, TiN, TaN, the like, or combinations thereof, and may be deposited by any suitable method, such as CVD or ALD.

In some embodiments, though not depicted, one or more work function layers may be formed conformally over the gate dielectric layer 356 before forming the gate electrode 358. The work function layers may include a P-type work function layer, an N-type work function layer, multi-layers thereof, or combinations thereof. In the discussion herein, a work function layer may also be referred to as a work function metal. Examples of the work function layers may include TiN, TaN, Ru, Mo, Al, $ZrSi_2$, $MoSi_2$, $TaSi_2$, $NiSi_2$, WN, Ti, Ag, TaAl, TaAlC, TiAlN, TaC, TaCN, TaSiN, Mn, Zr, the like, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, PVD, ALD, the like, or combinations thereof. Additional layers (not depicted) including a capping layer, a glue layer (or an adhesion layer), the like, or combinations thereof may also be formed between the gate dielectric layer 356 and the gate electrode 358 by any suitable method, such as CVD, PVD, ALD, MBD, the like, or combinations thereof. In some embodiments, the capping layer may include silicon, silicon oxide, silicon nitride, the like or combinations thereof. The glue layer may each include Ti, Ta, TiN, TaN, the like, or combinations thereof. In some embodiments, the work function layer(s), the capping layer, the glue layer, and/or the like may each be formed to have a U-shaped configuration over the first silicon oxide layer 350, which is also formed to have a U-shaped configuration.

Figure 17:
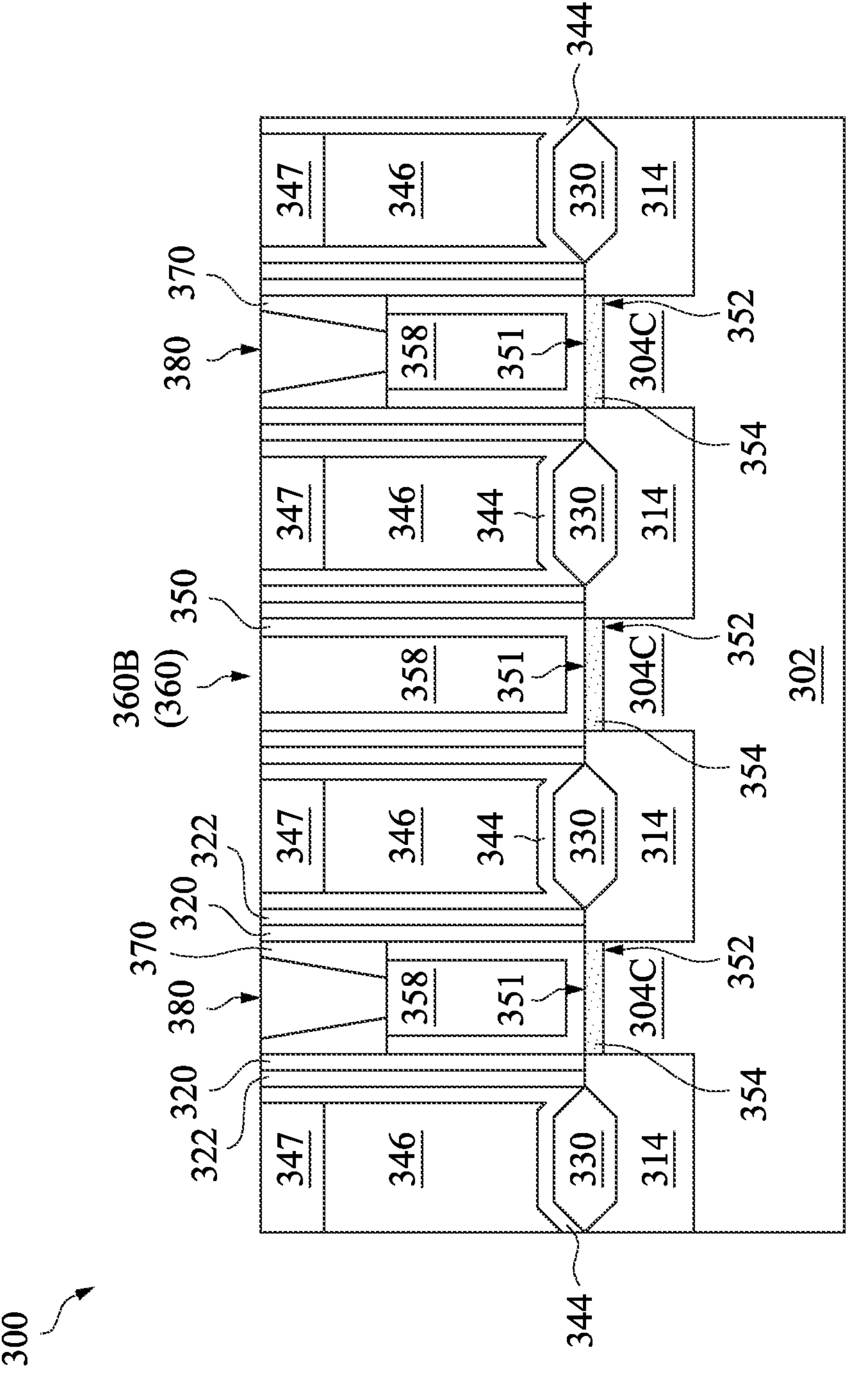

Referring to FIGS. 2 and 17, the method 200 at operation 224 performs additional operations to the device 300. For example, the method 200 may form one or more gate contacts 380 over and electrically coupled to one or more of the metal gate structures 360 (e.g., the metal gate structures 360A and 360C as depicted). The gate contact 380 may include any suitable metal, such as W, Cu, Ru, Al, Au, Co, the like, or combinations thereof. The gate contact 380 may be formed by recessing portions of the metal gate structure 360 to form a trench (not depicted), depositing a dielectric layer 370 in the trench, patterning the dielectric layer 370 to form a contact opening (not depicted), depositing a metal layer to fill the contact opening, and performing a planarization process, such as a CMP process, to form the gate contact 380. Additional features, such as interconnect features (e.g., vias and conductive lines) may be formed in various metallization layers (e.g., dielectric layers similar to the ILD layer 346) to electrically couple components of the device 300 with additional features.

The present disclosure provides semiconductor devices (e.g., FinFET devices), and methods of forming the same, that include a hybrid gate dielectric layer over a fin. The hybrid gate dielectric layer may include a first silicon oxide layer formed by a deposition process (e.g., a PEALD process) over a second silicon oxide layer by a thermal oxidation process (e.g., an ISSG process) after forming the first silicon oxide layer, such that the second silicon oxide layer is embedded between the fin and the first silicon oxide layer. In some embodiments, using the PEALD process to form the first silicon oxide layer lowers the sensitivity of the growth process on temperature and dependence on various crystallographic planes, thereby achieving uniform thickness of the gate dielectric layer. In some embodiments, implementing the thermal oxidation process after the PEALD process helps reduce positive charges (e.g., from nitrogen atoms introduced by the PEALD process) accumulating at an interface between the fin and the gate dielectric layer, thereby reducing noise issues during operation of the device.

In an aspect of the present disclosure, a semiconductor device includes a semiconductor fin. The semiconductor device includes a first silicon oxide layer contacting the semiconductor fin at a first interface and including nitrogen at a first concentration. The semiconductor device includes a second silicon oxide layer contacting the first silicon oxide layer at a second interface and including nitrogen at a second concentration that is greater than the first concentration. And the semiconductor device further includes a gate electrode over the second silicon oxide layer.

In another aspect of the present disclosure, a semiconductor device includes a semiconductor fin over a substrate. The semiconductor device includes a gate structure traversing a channel region of the semiconductor fin. The gate structure includes a first dielectric layer over the semiconductor fin along a first interface. The gate structure includes a second dielectric layer over the first dielectric layer along a second interface, where the first dielectric layer and the dielectric oxide layer include nitrogen and oxygen. A distribution of nitrogen has a first maximum within the second dielectric layer and a distribution of oxygen has a second maximum within the first dielectric layer. The gate structure further includes a gate electrode over the second dielectric layer.

In yet another aspect of the present disclosure, a method includes forming a semiconductor fin protruding from a substrate. The method includes forming a gate dielectric layer over a channel region of the semiconductor fin. The method further includes forming a gate electrode over the gate dielectric layer. Forming the gate dielectric layer includes depositing a first oxide layer over the semiconductor fin along a first interface. Forming the gate dielectric layer further includes oxidizing a portion of the semiconductor fin at the first interface to form a second oxide layer, such that the second oxide layer is embedded between the first oxide layer and the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a semiconductor fin;

a first silicon oxide layer contacting the semiconductor fin at a first interface and including nitrogen at a first concentration;

a second silicon oxide layer over and directly contacting the first silicon oxide layer at a second interface, the second silicon oxide layer including nitrogen at a second concentration that is greater than the first concentration; and a gate electrode over the second silicon oxide layer, wherein a distribution of oxygen has a maximum within the first silicon oxide layer.

2. The semiconductor device of claim 1, wherein the first silicon oxide layer includes oxygen at a third concentration and the second silicon oxide layer includes oxygen at a fourth concentration that is less than the third concentration.

3. The semiconductor device of claim 1, wherein a concentration of oxygen in each of the first silicon oxide layer and the second silicon oxide layer is greater than the first concentration and the second concentration, respectively.

4. The semiconductor device of claim 1, wherein the first silicon oxide layer includes carbon at a fifth concentration and the second silicon oxide layer includes carbon at a sixth concentration that is greater than the fifth concentration.

5. The semiconductor device of claim 1, wherein the first silicon oxide layer has a first thickness and the second silicon oxide layer has a second thickness that is less than or equal to the first thickness.

6. The semiconductor device of claim 1, wherein a ratio of the second concentration to the first concentration is at least 5.0.

7. The semiconductor device of claim 1, wherein a first outer sidewall of the second silicon oxide layer is separated from a second outer sidewall of the second silicon oxide layer by a first width near a top surface of the semiconductor fin and the first outer sidewall of the second silicon oxide layer is separated from the second outer sidewall of the second silicon oxide layer by a second width near a bottom surface of the semiconductor fin, and wherein a ratio of the second width to the first width is about 0.9 to about 1.0.

8. The semiconductor device of claim 1, wherein the second interface is vertically aligned with a sidewall of a lower portion of the semiconductor fin.

9. A semiconductor device, comprising:

a semiconductor fin over a substrate; and a gate structure traversing a channel region of the semiconductor fin, including:

a first dielectric layer over the semiconductor fin along a first interface;

a second dielectric layer over the first dielectric layer along a second interface, the first dielectric layer and the second dielectric oxide layer including nitrogen and oxygen, wherein a distribution of nitrogen has a first maximum within the second dielectric layer and a distribution of oxygen has a second maximum within the first dielectric layer; and a gate electrode over the second dielectric layer.

10. The semiconductor device of claim 9, wherein the first dielectric layer and the second dielectric layer both include silicon oxide.

11. The semiconductor device of claim 9, wherein the first dielectric layer and the second dielectric layer further include carbon, and wherein a distribution of carbon has a third maximum within the second dielectric layer.

12. The semiconductor device of claim 9, wherein the first dielectric layer has a first thickness and the second dielectric layer has a second thickness, and wherein a ratio of the first thickness to the second thickness is at least 0.2.

13. The semiconductor device of claim 12, wherein the ratio of the first thickness to the second thickness is less than 1.0.

14. The semiconductor device of claim 9, wherein the first dielectric layer has a first concentration of nitrogen and the second dielectric layer has a second concentration of nitrogen, and wherein a ratio of the second concentration to the first concentration is at least 5.0.

15. A semiconductor device, comprising:

a semiconductor fin; and a gate structure traversing a channel region of the semiconductor fin, comprising:

a first dielectric layer over the semiconductor fin, wherein the first dielectric layer comprises nitrogen at a first concentration and oxygen at a third concentration; and a second dielectric layer over the first dielectric layer, wherein the second dielectric layer comprises nitrogen at a second concentration that is greater than the first concentration and oxygen at a fourth concentration that is that is less than the third concentration, and wherein a distribution of oxygen has a maximum within the first dielectric layer.

16. The semiconductor device of claim 15, comprising a gate electrode over the second dielectric layer.

17. The semiconductor device of claim 16, wherein the first dielectric layer and the second dielectric layer include silicon oxide.

18. The semiconductor device of claim 15, wherein the first dielectric layer comprises carbon at a fifth concentration and the second dielectric layer comprises carbon at a sixth concentration layer that is greater than the fifth concentration.

19. The semiconductor device of claim 15, wherein the fourth concentration is greater than the second concentration.

20. The semiconductor device of claim 15, wherein the first dielectric layer has a first thickness and the second dielectric layer has a second thickness, and wherein a ratio of the first thickness to the second thickness is at least 0.2 and less than 1.0.

* * * * *